US011984278B2

(12) United States Patent
Shimoyama

(10) Patent No.: US 11,984,278 B2
(45) Date of Patent: May 14, 2024

(54) HINGE STRUCTURE OF BUTTON AND ELECTRONIC DEVICE

(71) Applicant: JVCKENWOOD Corporation, Yokohama (JP)

(72) Inventor: Takeshi Shimoyama, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 297 days.

(21) Appl. No.: 17/474,093

(22) Filed: Sep. 14, 2021

(65) Prior Publication Data

US 2021/0407747 A1 Dec. 30, 2021

Related U.S. Application Data

(63) Continuation of application No. PCT/JP2019/040498, filed on Oct. 15, 2019.

(30) Foreign Application Priority Data

Mar. 25, 2019 (JP) ................................ 2019-057481

(51) Int. Cl.
*H05K 5/00* (2006.01)
*H01H 13/14* (2006.01)
*H01H 13/20* (2006.01)

(52) U.S. Cl.
CPC ............ *H01H 13/20* (2013.01); *H01H 13/14* (2013.01); *H05K 5/0017* (2013.01)

(58) Field of Classification Search
CPC .. H01H 13/20; H01H 13/14; H01H 2221/044; H01H 2221/058;

(Continued)

(56) References Cited

U.S. PATENT DOCUMENTS 8,618,429 B2 * 12/2013 Sugawara .......... G03G 15/5016 200/344
9,256,293 B2 * 2/2016 Miyagawa ........... H01H 13/807

(Continued)

FOREIGN PATENT DOCUMENTS

JP 03-057840 6/1991
JP 2000-123669 4/2000

(Continued)

OTHER PUBLICATIONS

English Translation of Ikeuchi JP2017-174724A, Sep. 28 2017. (Year: 2023).*

(Continued)

*Primary Examiner* — Anthony Q Edwards
*Assistant Examiner* — Hung Q Dang
(74) *Attorney, Agent, or Firm* — Amin, Turocy & Watson, LLP

(57) ABSTRACT

For suppressing wobbling of a button while suppressing reactive force generated when the button is pressed, a hinge structure of a button includes a contact portion contacting a substrate on which the button is arranged, a button main body varying in a relative positional relationship with the substrate, a first hinge having flexibility, and being coupled to the button main body at one end and coupled to the contact portion at another end, and a second hinge having flexibility, and being coupled at one end to a position in the button main body on an opposite side on which the first hinge is coupled to the button main body, and coupled at another end to the first hinge at a position in the button main body on a side on which the first hinge is coupled.

7 Claims, 4 Drawing Sheets

(58) Field of Classification Search
CPC ............. H01H 2221/062; H01H 13/84; H01H 13/7065; H05K 5/0017
See application file for complete search history.

(56) References Cited

U.S. PATENT DOCUMENTS

| | | | | |
|---|---|---|---|---|
| 2007/0139357 | A1* | 6/2007 | Wang | G06F 1/1601 345/104 |
| 2009/0322569 | A1* | 12/2009 | Haruyama | H01H 13/88 341/22 |
| 2010/0116637 | A1* | 5/2010 | Kano | G03G 15/5016 200/345 |

FOREIGN PATENT DOCUMENTS

| | | |
|---|---|---|
| JP | 2000-306461 | 11/2000 |
| JP | 2017-174724 | 9/2017 |

OTHER PUBLICATIONS

International Search Report and Written Opinion for International Application No. PCT/JP2019/040498 dated Dec. 24, 2019, 9 pages.

* cited by examiner

A-A CROSS SECTION (UPPER SIDE)

(FRONT SIDE)

(BACK SIDE)

(LOWER SIDE)

B-B CROSS SECTION

HINGE STRUCTURE OF BUTTON AND ELECTRONIC DEVICE

CROSS-REFERENCE TO RELATED APPLICATION

This application is a Continuation of PCT International Application No. PCT/JP2019/040498 filed on Oct. 15, 2019 which claims the benefit of priority from Japanese Patent Application No. 2019-057481 filed on Mar. 25, 2019, the entire contents of both of which are incorporated herein by reference.

BACKGROUND

1. Technical Field

The present disclosure relates to a hinge structure of a button, and an electronic device.

2. Description of the Related Art

Push-type buttons for performing input operations by being pressed by a user include a button that is supported by an elastically-deforming hinge, and can be pressed by the hinge elastically deforming. For example, JP 2000-123669 A discloses supporting one end portion of a button in a longer direction by a hinge, and JP 2000-306461 A discloses supporting both end sides of a button in the longer direction by a hinge.

Nevertheless, in a case where one end portion of the button in the longer direction is supported by the hinge as described in JP 2000-123669 A, because the button is supported at one point, the button becomes likely to rotate around the hinge. Thus, when the button is pressed, there is concern that the button easily wobbles. In addition, in a case where both end sides of the button in the longer direction is supported by the hinge as described in JP 2000-306461 A, although the button easily stabilizes, reactive force generated when the button is pressed increases, and particularly in a case where hinges are arranged at four corners of the button, reactive force greatly increases. In this case, there is concern that pressing feeling felt when the button is pressed easily worsens.

SUMMARY

It is an object of the present disclosure to at least partially solve the problems in the conventional technology.

To solve the above problem and achieve the object, a hinge structure of a button according to this disclosure is disclosed. The hinge structure includes a contact portion contacting an arrangement portion in which a button is arranged, a button main body varying in a relative positional relationship with the arrangement portion, a first hinge having flexibility, and being coupled to the button main body at one end and coupled to the contact portion at another end, and a second hinge having flexibility, and being coupled at one end to a position in the button main body on an opposite side on which the first hinge is coupled to the button main body, and coupled at another end to the first hinge at a position in the button main body on a side on which the first hinge is coupled.

Further, to solve the above problem and achieve the object, an electronic device according to this disclosure includes a display panel having a display surface on a front surface, a front panel surrounding a periphery of the display panel, and a hinge structure of a button according to claim 1 that is surrounded by the front panel.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Hereinafter, a hinge structure of a button and an electronic device according to the present embodiment will be described in detail based on the drawings. Note that the present disclosure is not limited by the embodiment. In addition, components in the following embodiment include components that can be replaced or easily conceived by the one skilled in the art, or substantively equivalent components.

Embodiment

Figure 1:
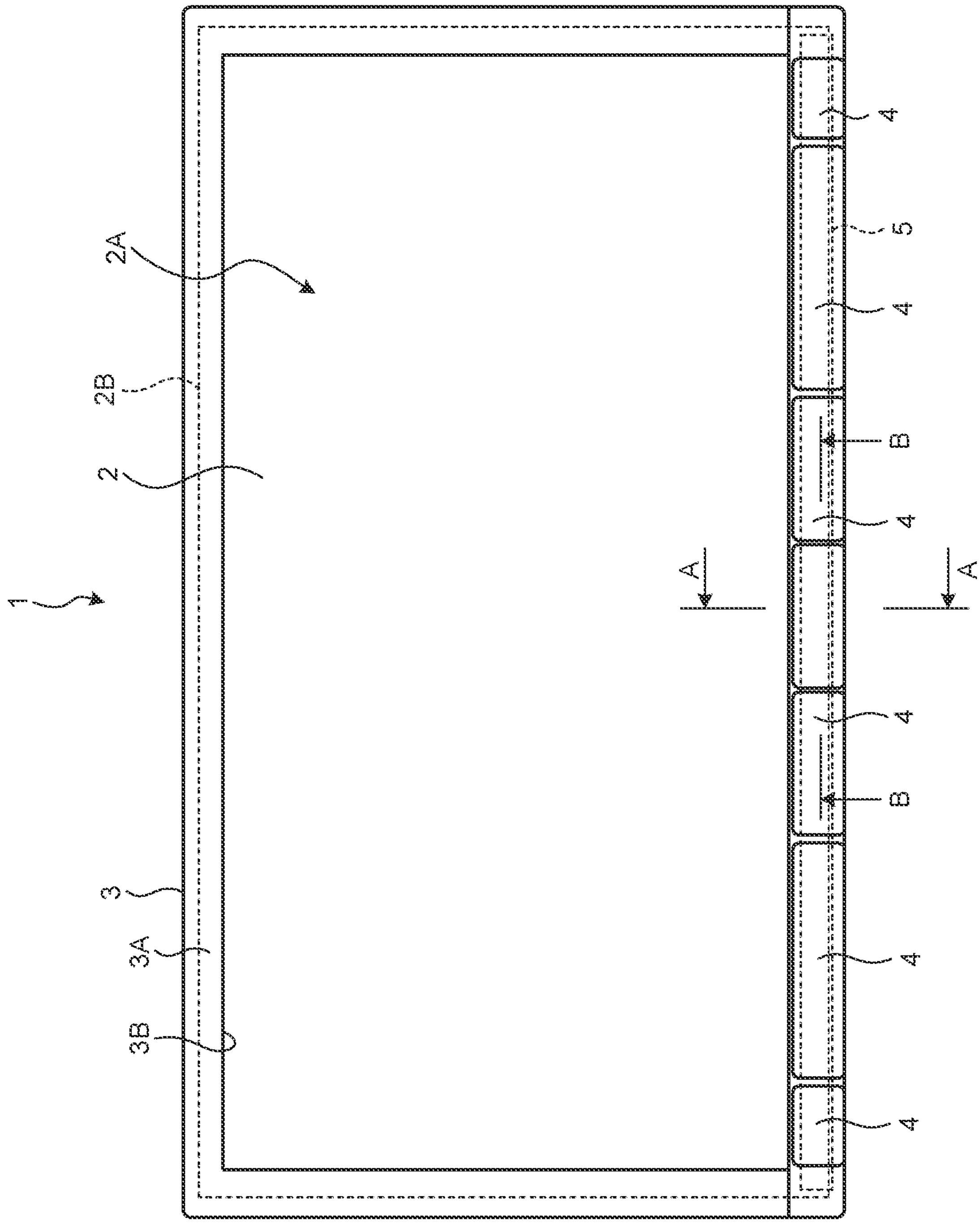
FIG. 1 is a front view illustrating an electronic device according to an embodiment.
Figure 2:
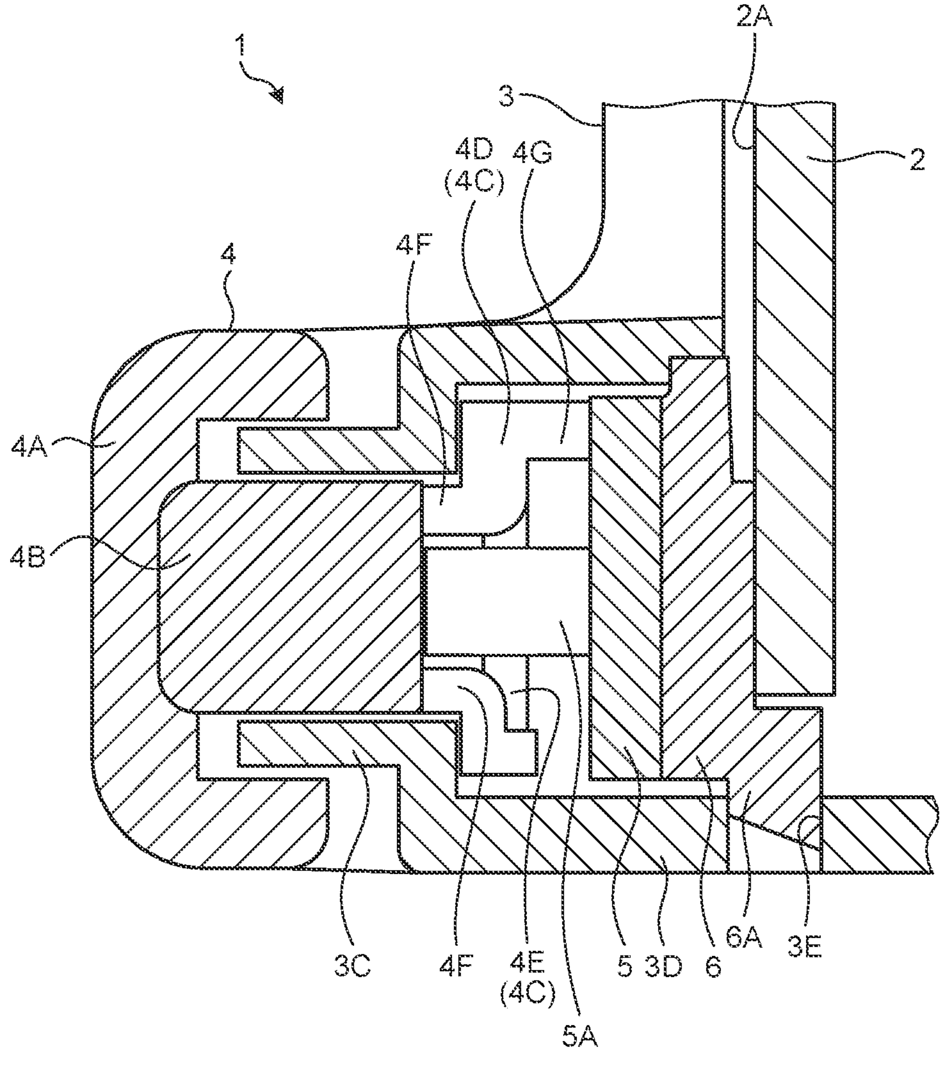
FIG. 2 is a cross-sectional view taken along an A-A line in FIG. 1.

FIG. 1 is a front view illustrating an electronic device 1 according to an embodiment. FIG. 2 is a cross-sectional view taken along an A-A line in FIG. 1. As illustrated in FIGS. 1 and 2, the electronic device 1 according to the present embodiment is an audio visual (AV) integrated car navigation device mounted inside a vehicle, for example. The electronic device 1 includes a display panel 2, a front panel 3, a button 4, a substrate 5, and a holder unit 6.

Note that, in the following description, an upper side in normal use of the electronic device 1 will be described as an upper side also in the electronic device 1, and a lower side in normal use of the electronic device 1 will be described as a lower side also in the electronic device 1. In addition, in the following description, a horizontal direction when the electronic device 1 is viewed from the front panel 3 side will be described as a horizontal direction also in the electronic device 1.

The display panel 2 is formed in a rectangular shape, and has a display surface 2A on the front surface. The front surface is a surface to be viewed by an operator. In the case of a car navigation device, because the car navigation device is arranged in a front portion in a car, the front surface is a surface facing backward inside the car. The display surface 2A has a rectangular shape smaller than the rectangular shape of the display panel 2, and is arranged on the inner side of an outer rim 2B of the display panel 2. In the present embodiment, the display panel 2 has a configuration in which the display surface 2A is formed as a pressure-sensitive touch panel.

The front panel 3 is formed in a rectangular shape in such a manner as to surround the periphery of the display panel 2. The front panel 3 includes a rectangular frame portion 3A surrounding the periphery of the display panel 2, and a rectangular window portion 3B for opening the display surface 2A of the display panel 2 inside the frame portion 3A.

As illustrated in FIG. 1, a plurality of buttons 4 is arranged side by side in the horizontal direction on the lower side of the front panel 3, and on the front side of the front panel 3. As illustrated in FIG. 2, the buttons 4 include a key 4A, a button main body 4B, and a hinge 4C. The key 4A is a portion that appears on the front side and the exterior side of the front panel 3, and is a portion on which an operator performs a pressing operation. The button main body 4B is arranged on the back side of the key 4A, and the hinge 4C is integrally connected to the back side thereof. The button main body 4B and the hinge 4C are formed of resin material. The hinge 4C is formed in a stick shape or a plate shape in such a manner as to be elastically deformed, and is formed in a curved or bent manner. Accordingly, the button main body 4B is provided so as to be movable toward the back side together with the key 4A due to deformation of the hinge 4C in a case where the key 4A is pressed toward the back side by an operator. In addition, in a case where an operator does not operate the key 4A, the button main body 4B is biased together with the key 4A toward a position moved toward the front side, due to elasticity of the hinge 4C.

Note that the front panel 3 is provided with a guide portion 3C so as to surround the button main body 4B vertically and horizontally as illustrated in FIG. 2, and configured to guide the movement of the button main body 4B by the guide portion 3C. The key 4A is arranged with covering the front side of the guide portion 3C so as not to disturb the movement of the button main body 4B.

The substrate 5 is arranged along the front surface of the display panel 2 in a lower part of the display panel 2. In the present embodiment, the substrate 5 is continuously provided in the horizontal direction. As illustrated in FIG. 2, a switch element 5A being a tact switch is mounted on the front surface of the substrate 5. In addition, on the front side of the substrate 5, the plurality of buttons 4 is adjacently arranged, and the switch element 5A is arranged with facing the back side of the button main body 4B in the plurality of buttons 4. Accordingly, in a case where the key 4A is pressed toward the back side by an operator, the switch element 5A operates by the button main body 4B moving toward the back side together with the key 4A due to deformation of the hinge 4C. Note that the switch element 5A is not limited to one switch element 5A provided on the back side in one button 4, and a plurality of switch elements 5A may be arranged. The substrate 5 is accommodated in the front panel 3. Specifically, a case portion 3D extending toward the back surface from the above-described guide portion 3C, and surrounding the substrate 5 vertically and horizontally is formed in the front panel 3. The substrate 5 is accommodated in the case portion 3D.

As illustrated in FIG. 2, in the lower part of the display panel 2, the holder unit 6 is provided to be sandwiched between the front surface of the display panel 2 and the back surface of the substrate 5. The holder unit 6 is formed in a plate shape, provided so as to block the back side of the case portion 3D of the front panel 3 in which the substrate 5 is accommodated, and is attached to the front panel 3. Specifically, the holder unit 6 includes a protrusion 6A to be inserted into a through hole 3E formed in a bottom portion of the front panel 3, and is attached to the front panel 3 by the protrusion 6A being fitted into the through hole 3E.

In addition, the holder unit 6 is provided in contact with the back surface of the substrate 5 by being attached to the front panel 3. As described above, in a case where the key 4A is pressed toward the back side by an operator, the switch element 5A of the substrate 5 operates by the button main body 4B moving toward the back side together with the key 4A due to deformation of the hinge 4C. At this time, by contacting the back surface of the substrate 5, the holder unit 6 generates reactive force against the substrate 5 being pressed toward the back side.

Figure 3:
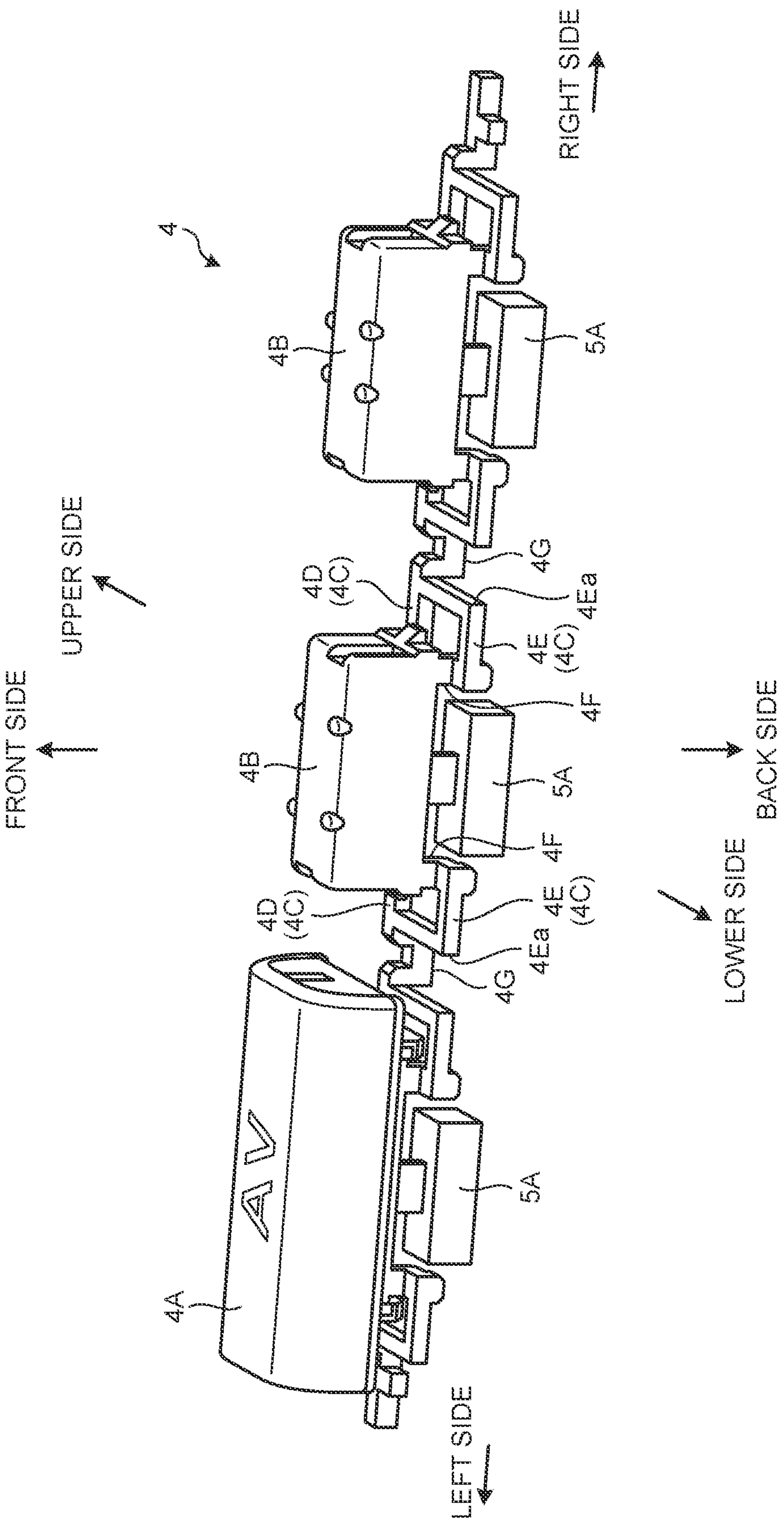
FIG. 3 is a perspective view of a button main body and a hinge illustrated in FIG. 2.
Figure 4:
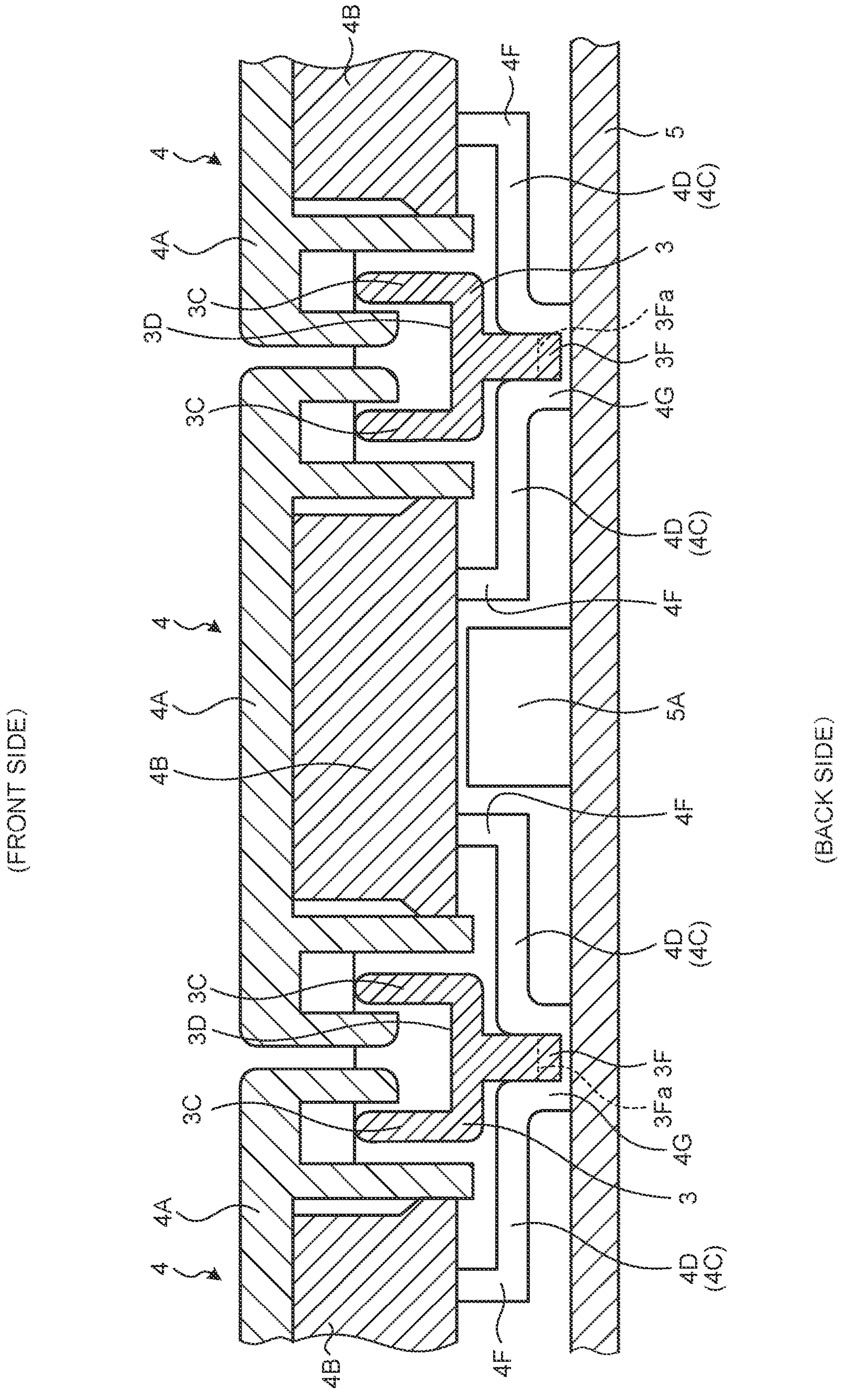
FIG. 4 is a cross-sectional view taken along a B-B line in FIG. 1.

Next, a hinge structure of the button 4 will be described. FIG. 3 is a perspective view of the button main body 4B and the hinge 4C illustrated in FIG. 2. FIG. 4 is a cross-sectional view taken along a B-B line in FIG. 1. The buttons 4 are arranged on the front side of the substrate 5 serving as an arrangement portion in which the buttons 4 are arranged, and include the key 4A, the button main body 4B, the hinge 4C, and a contact portion 4G.

As described above, the button main body 4B is arranged on the back side of the key 4A in the buttons 4, and operates the switch element 5A in a case where the key 4A is pressed toward the back side by an operator. That is, the button main body 4B is provided in such a manner that a relative positional relationship with the substrate 5 can vary. Thus, the button main body 4B can operate the switch element 5A by getting closer to the substrate 5 and thereby contacting the switch element 5A arranged on the substrate 5, in a case where the key 4A is pressed toward the back side by an operator. The button main body 4B is formed as a block having a substantially cuboid shape, for example, and is formed of resin material. The button main body 4B is arranged in such a direction that a longer direction of the cuboid corresponds to the horizontal direction of the electronic device 1, a shorter direction corresponds to a vertical direction of the electronic device 1, and a height direction corresponds to a direction of the front surface and the back surface of the electronic device 1.

FIG. 3 illustrates a configuration in which three button main bodies 4B are arranged in the horizontal direction, and the left button main body 4B is in a state in which the key 4A is attached, and the two button main bodies 4B on the right side are in a state in which the key 4A is removed.

As described above, the hinge 4C is formed of resin material, integrally connected to the button main body 4B, and enables the button main body 4B to move together with the key 4A by the elastic deformation of itself. The button main body 4B is provided with arm portions 4F extending toward the back side, at four points corresponding to upper, lower, left, and right points on the back side, and the arm portions 4F at four points are respectively arranged near four corners on the back side of the button main body 4B. The hinge 4C is connected to the arm portions 4F formed in this manner, and coupled to the button main body 4B via the arm portions 4F. The hinge 4C includes a first hinge 4D and a second hinge 4E, and two first hinges 4D and two second hinges 4E are provided for one button main body 4B. The first hinge 4D and the second hinge 4E are both formed in a stick shape, and end portions are coupled to the arm portions 4F. In addition, the first hinge 4D and the second hinge 4E are respectively arranged on both end sides in the longer direction of the button main body 4B.

The first hinges 4D respectively arranged on both end sides in the longer direction of the button main body 4B are coupled to the button main body 4B on the same side in the shorter direction of the button main body 4B. More specifically, the two first hinges 4D are coupled at the respective ends to the two arm portions 4F (refer to FIG. 4) positioned closer to the upper side of the button main body 4B in the vertical direction of the electronic device 1 among the four arm portions 4F provided on the button main body 4B, and extend from the arm portions 4F in an opposite direction of the side on which the other first hinge 4D is positioned, in the longer direction of the button main body 4B. In other words, the two first hinges 4D coupled to one button main body 4B are respectively coupled to positions that are near different end portions in the longer direction of the button main body 4B, and closer to the upper side of the electronic device 1 in the shorter direction of the button main body 4B, and extend in the longer direction of the button main body 4B. The first hinges 4D coupled to the button main body 4B via the arm portions 4F in this manner have flexibility, and can warp using an end portion on the side coupled to the button main body 4B, as a fulcrum.

In addition, the second hinges 4E respectively arranged on both end sides in the longer direction of the button main body 4B are coupled to the button main body 4B on an opposite side of the side on which the first hinges 4D are coupled, in the shorter direction of the button main body 4B. More specifically, the two second hinges 4E coupled to the button main body 4B are coupled at the respective ends to the two arm portions 4F (refer to FIG. 3) positioned closer to the lower side of the button main body 4B in the vertical direction of the electronic device 1 among the four arm portions 4F provided on the button main body 4B. In addition, the other ends of the second hinges 4E are coupled to the first hinges 4D at positions on the side on which the first hinges 4D are coupled to the button main body 4B, that is to say, positions on the upper side of the electronic device 1 in the shorter direction of the button main body 4B.

More specifically, the second hinge 4E extends from the position coupled to the arm portion 4F, in an opposite direction of the side on which the other second hinge 4E is positioned, in the longer direction of the button main body 4B, and bends at a predetermined position in a direction in which the first hinge 4D is positioned, in the shorter direction of the button main body 4B. In other words, the second hinge 4E includes a bend portion 4Ea, and bends by about 90° in the bend portion 4Ea. Thus, in the second hinge 4E, a portion between the bend portion 4Ea and an end portion on the side coupled to the arm portion 4F extends in the longer direction of the button main body 4B, and a portion between the bend portion 4Ea and an end portion on the side coupled to the first hinge 4D extends in the shorter direction of the button main body 4B.

In addition, the second hinge 4E has flexibility similarly to the first hinge 4D, and can warp using an end portion on the side coupled to the button main body 4B via the arm portion 4F, as a fulcrum. Thus, the first hinge 4D and the second hinge 4E that are positioned on the same side in the longer direction of the button main body 4B, and coupled to each other by an end portion of the second hinge 4E being coupled to the first hinge 4D can warp integrally. In other words, the hinge 4C including the first hinge 4D and the second hinge 4E can warp in such a manner that the first hinge 4D and the second hinge 4E are integrated.

The contact portion 4G is coupled to an end portion of the first hinge 4D on the opposite side of an end portion on the side coupled to the button main body 4B via the arm portion 4F, and is provided on an extended line of the first hinge 4D extending in the longer direction of the button main body 4B. In other words, the first hinge 4D coupled to the button main body 4B at one end is coupled to the contact portion 4G at another end. The contact portion 4G is formed in a U shape having an opened side corresponding to the front side of the electronic device 1 in a case where the contact portion 4G is viewed in the vertical direction of the electronic device 1, that is to say, in a case where the contact portion 4G is viewed in the shorter direction of the button main body 4B, and the first hinge 4D is coupled to one end portion of two end portions of the opened side of the U shape of the contact portion 4G. In this manner, the contact portion 4G to which the first hinge 4D is coupled becomes a portion of the button 4 that contacts the substrate 5 being an arrangement portion in which the button 4 is arranged. The contact portion 4G contacts the substrate 5 on a surface on the side positioned on an opposite side of the end portion of the opened side, in a portion on a blocked side of the U shape.

In all of the plurality of buttons 4 arranged on the front side of the substrate 5, the side on which the first hinges 4D are coupled to the button main body 4B, and the side on which the second hinges 4E are coupled to the button main body 4B in the shorter direction of the button main body 4B become the same. In the present embodiment, in all buttons 4 of the plurality of buttons 4, the first hinges 4D are coupled to the button main body 4B on the upper side of the electronic device 1 in the shorter direction of the button main body 4B, and the second hinges 4E are coupled to the button main body 4B on the lower side of the electronic device 1 in the shorter direction of the button main body 4B.

Furthermore, adjacent buttons 4 of the plurality of buttons 4 share the contact portion 4G. One button 4 of the adjacent buttons 4 is coupled at the first hinge 4D to one end portion of two end portions on the opened side of the U shape of the contact portion 4G, and the other button 4 is coupled at the first hinge 4D to another end portion of the two end portions on the opened side of the U shape of the contact portion 4G. With this configuration, adjacent buttons 4 share the contact portion 4G, and are coupled via the contact portion 4G.

The button main body 4B, the hinge 4C, the arm portions 4F, and the contact portion 4G formed in this manner are integrally formed by molding using resin material.

In the front panel 3 in which the guide portion 3C surrounding the button main body 4B vertically and horizontally is provided, a support portion 3F is formed (refer to FIG. 4). In the front panel 3, the support portion 3F is formed in a rib shape extending toward the back side toward the substrate 5 within the case portion 3D accommodating the substrate 5. A leading end of the support portion 3F that extends toward the back side contacts the contact portion 4G of the button 4. More specifically, the leading end of the support portion 3F that faces the back side is inserted into the portion of the opened side of the U shape of the contact portion 4G, and fitted with the contact portion 4G. In addition, a groove 3Fa is formed at the leading end of the support portion 3F that faces the back side. The groove 3Fa is formed with penetrating through the support portion 3F in the horizontal direction of the support portion 3F, and being opened toward the back side, and is fitted with the contact portion 4G by the contact portion 4G entering. The contact portion 4G is pressed against the substrate 5 by being fitted with the groove 3Fa of the support portion 3F. By being supported by the support portion 3F in a state of being fitted with the groove 3Fa of the support portion 3F, the contact portion 4G is supported with being in contact with the front surface of the substrate 5 in a state in which movements in the vertical direction and the horizontal direction are regulated. In other words, the button 4 is fixed in a state in which the contact portion 4G is in contact with the substrate 5.

The hinge structure of the button 4 and the electronic device 1 according to the present embodiment include the above-described configurations, and the functions thereof will be described below. When performing an input operation on the button 4, an operator performs a pressing operation on the key 4A of the button 4 using a finger, for example. With this configuration, force in a back surface direction is input to the button 4 from the front side. Because the hinge 4C of the button 4 that has flexibility is coupled to the button main body 4B, and the button main body 4B is supported by the hinge 4C, when force in the back surface direction is input to the button 4, the hinge 4C warps by the force. The button main body 4B thereby moves in the back surface direction, and contacts the switch element 5A arranged on the substrate 5, at a position between the button main body 4B and the substrate 5. The switch element 5A thereby operates, detects that an input operation has been performed on the button 4, and conveys that an input operation has been performed on the button 4, to a control unit (not illustrated) of the electronic device 1. With this configuration, the control unit controls the electronic device 1 to perform an operation allocated to the button 4, that is to say, an operation to be performed when an input operation is performed on the button 4.

In a case where an operator lets off the finger from the button 4 after performing an input operation on the button 4, the button main body 4B moves in a direction getting away from the substrate 5, that is to say, moves in the front surface direction by the elasticity of the hinge 4C. The button main body 4B is thereby separated from the switch element 5A, and the button 4 returns to a state before the input operation is performed.

When an input operation is performed on the button 4, the hinge 4C warps in this manner and the button main body 4B moves in a direction getting closer to the substrate 5. The hinge 4C includes the first hinge 4D coupled to the contact portion 4G, and the second hinge 4E that includes the bend portion 4Ea and is coupled to the first hinge 4D. That is, the second hinge 4E includes a portion extending in the longer direction of the button main body 4B, between the bend portion 4Ea and a position coupled to the button main body 4B, and a portion extending in the shorter direction of the button main body 4B, between the bend portion 4Ea and a position coupled to the first hinge 4D, and has a total length longer than the first hinge 4D. In other words, because the second hinge 4E includes the bend portion 4Ea, and includes a portion extending from the position of the bend portion 4Ea in the shorter direction of the button main body 4B, the total length becomes longer as compared with a case where the second hinge 4E is formed to extend only in the longer direction of the button main body 4B without including the bend portion 4Ea. Thus, the second hinge 4E easily warps by force input from the outside, and the entire hinge 4C accordingly easily warps. With this configuration, the button main body 4B of the button 4 can move in the back surface direction without applying large force in an input operation, and reactive force generated when an input operation is performed becomes smaller.

On the other hand, in the hinge 4C, the first hinge 4D supports the button main body 4B by being coupled to the button main body 4B from one side in the shorter direction of the button main body 4B, and the second hinge 4E supports the button main body 4B by being coupled to the button main body 4B from the other side in the shorter direction of the button main body 4B. With this configuration, the hinge 4C supports the button main body 4B on both end sides in the longer direction, and on both end sides in the shorter direction, and stably supports the button main body 4B without wobbling.

In the hinge structure of the button 4 and the electronic device 1 according to the above-described embodiment, because the hinge 4C supporting the button main body 4B includes the first hinge 4D and the second hinge 4E that are coupled to the button main body 4B on mutually opposite sides, the button main body 4B can be stably supported. In addition, because the first hinge 4D and the second hinge 4E each have flexibility, and an end portion of the second hinge 4E on the opposite side of the side coupled to the button main body 4B is coupled to the first hinge 4D at a position on the side on which the first hinge 4D is coupled to the button main body 4B, the total length of the second hinge 4E can be made longer than the first hinge 4D. With this configuration, it is possible to cause the second hinge 4E to warp easily, and it is possible to reduce reactive force generated when the button main body 4B is moved by pressing force generated in an input operation on the button 4. Consequently, it is possible to suppress wobbling of the button 4 while suppressing reactive force generated when the button 4 is pressed.

In addition, because the adjacent buttons 4 share the contact portion 4G, a distance between the adjacent buttons 4 can be made smaller. As a result, compactification can be achieved when the plurality of buttons 4 is arranged side by side, and the plurality of buttons 4 can be arranged in a narrow region.

In addition, because the button 4 is arranged on the substrate 5 on which the switch element 5A is arranged, downsizing of a portion around the button 4 can be achieved, and members used for arranging the button 4 can be simplified. As a result, downsizing of a device using the button 4 can be achieved, and manufacturing cost can be reduced.

In addition, because the first hinge 4D and the second hinge 4E are respectively arranged on the both end sides in the longer direction of the button main body 4B, it is possible to appropriately support the button main body 4B using the first hinge 4D and the second hinge 4E on the both end sides in the longer direction. Consequently, it is possible to suppress wobbling of the button 4 while more surely suppressing reactive force generated when the button 4 is pressed.

In addition, because the first hinges 4D respectively arranged on the both end sides in the longer direction of the button main body 4B are coupled to the button main body 4B on the same side in the shorter direction of the button main body 4B, it is possible to make reactive force from the button 4 that is generated when a pressing operation is performed on the button 4, constant in the longer direction of the button 4. As a result, it is possible to improve operational feeling felt when an input operation is performed on the button 4, and improve the quality of the button 4.

In addition, because the contact portion 4G is arranged on an extended line of the first hinges 4D respectively arranged on both end sides in the longer direction of the button main body 4B, it is possible to support the button main body 4B using the contact portion 4G and the first hinge 4D from both sides in the longer direction of the button main body 4B. With this configuration, it is possible to more surely make reactive force from the button 4 that is generated when a pressing operation is performed on the button 4, constant in the longer direction of the button 4. As a result, it is possible to more surely improve operational feeling felt when an input operation is performed on the button 4, and more surely improve the quality of the button 4.

Modified Example

Note that, in the above-described embodiment, the first hinges 4D arranged on the both end sides in the longer direction of the button main body 4B are coupled to the button main body 4B on the same side in the shorter direction of the button main body 4B, but the first hinges 4D arranged on the both end sides of the button main body 4B may be coupled to mutually different sides in the shorter direction of the button main body 4B. In addition, in the above-described embodiment, the side on which the first hinges 4D are coupled to the button main body 4B, and the side on which the second hinges 4E are coupled to the button main body 4B in the shorter direction of the button main body 4B become the same in all of the plurality of buttons 4, but sides to which the first hinge 4D and the second hinge 4E are coupled may vary among the buttons 4. It is preferable that a side on which the first hinge 4D or the second hinge 4E is coupled to the button main body 4B in the shorter direction of the button main body 4B is appropriately set in accordance with the size of the button 4, a function allocated to the button 4, and the like.

A hinge structure of a button and an electronic device according to the present embodiment can bring about an effect of suppressing wobbling of a button while suppressing reactive force generated when the button is pressed.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A hinge structure of a button, the hinge structure comprising:

a contact portion contacting an arrangement portion in which a button is arranged;

a button main body varying in a relative positional relationship with the arrangement portion;

a first hinge having flexibility, and being coupled to the button main body at one end and coupled to the contact portion at another end; and a second hinge having flexibility, and being coupled at one end to a position in the button main body on an opposite side on which the first hinge is coupled to the button main body, and coupled at another end to the first hinge at a position in the button main body on a side on which the first hinge is coupled, the another end of the second hinge being coupled to the another end of the first hinge without the contact portion, the second hinge bending at a predetermined position in a direction in which the first hinge is positioned.

2. The hinge structure of a button according to claim 1, wherein a plurality of the buttons is adjacently arranged in the arrangement portion, and wherein the adjacent buttons share the contact portion.

3. The hinge structure of a button according to claim 1, wherein the arrangement portion is a substrate on which a switch element to be contacted by the button main body is arranged.

4. The hinge structure of a button according to claim 1, wherein the first hinge and the second hinge are respectively arranged on both end sides in a longer direction of the button main body.

5. The hinge structure of a button according to claim 4, the hinge structure comprising respective first hinges, comprising the first hinge and another first hinge, wherein the respective first hinges respectively arranged on both end sides in the longer direction of the button main body are coupled to the button main body on a same side in a shorter direction of the button main body.

6. The hinge structure of a button according to claim 5, wherein the contact portion is arranged on an extended line of the respective first hinges respectively arranged on both end sides in the longer direction of the button main body.

7. An electronic device comprising:

a display panel having a display surface on a front surface;

a front panel surrounding a periphery of the display panel; and a hinge structure of a button according to claim 1 that is surrounded by the front panel.

* * * * *